(12) United States Patent
Oppermann et al.

(10) Patent No.: US 9,917,070 B2
(45) Date of Patent: Mar. 13, 2018

(54) METHOD FOR ARRANGING ELECTRONIC SWITCHING ELEMENTS, ELECTRONIC SWITCHING ARRANGEMENT AND USE OF A CARRIER HAVING A BONDING LAYER

(71) Applicant: Fraunhofer-Gesellschaft zur Förderung der angewandten Forschung e.V., München (DE)

(72) Inventors: Hans-Hermann Oppermann, Berlin (DE); Kai Zoschke, Berlin (DE); Lena Goullon, Berlin (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 15/115,541

(22) PCT Filed: Jan. 28, 2015

(86) PCT No.: PCT/EP2015/051742
§ 371 (c)(1),
(2) Date: Jul. 29, 2016

(87) PCT Pub. No.: WO2015/114026
PCT Pub. Date: Aug. 6, 2015

(65) Prior Publication Data
US 2017/0170141 A1    Jun. 15, 2017

(30) Foreign Application Priority Data

Jan. 30, 2014 (DE) .................. 10 2014 201 635

(51) Int. Cl.
*H01L 23/00* (2006.01)
*H01L 25/065* (2006.01)
(Continued)

(52) U.S. Cl.
CPC .......... *H01L 24/83* (2013.01); *H01L 21/6835* (2013.01); *H01L 24/05* (2013.01);
(Continued)

(58) Field of Classification Search
CPC ......... H01L 24/83; H01L 24/81; H01L 24/95; H01L 21/6835; H01L 24/75; H01L 24/05;
(Continued)

(56) References Cited

U.S. PATENT DOCUMENTS 5,960,260 A    9/1999 Umehara et al.
5,981,360 A    11/1999 Rabarot et al.
(Continued)

FOREIGN PATENT DOCUMENTS

DE    10054159 A1    5/2002
DE    10341186 A1    3/2005
(Continued)

OTHER PUBLICATIONS

"International Application Serial No. PCT/EP2015/051742, International Preliminary Report on Patentability dated Aug. 11, 2016", (Aug. 11, 2016), 16 pgs.
(Continued)

*Primary Examiner* — Alexander Oscar Williams
(74) *Attorney, Agent, or Firm* — Schwegman Lundberg & Woessner, P.A.

(57) ABSTRACT

A method for arranging electronic components that includes a plurality of electronic components pasted onto a first front face of a carrier having a bonding layer. The front face and/or the electronic components being provided with a plurality of bonding points and the diameter of and distance between the bonding points are selected such that each of the plurality of electronic components is attached by at least three bonding points to the carrier having the bonding layer. The method also includes arranging at least one portion of
(Continued)

the plurality of the components on a switching element carrier and connecting the components to the carrier. The method also includes detaching a component from the carrier having a bonding layer, using a solvent or a mechanical force that separates the carrier having a bonding layer and the switching element carrier from one another.

12 Claims, 6 Drawing Sheets

(51) Int. Cl.
*H01L 25/00* (2006.01)
*H01L 21/683* (2006.01)
(52) U.S. Cl.
CPC .............. *H01L 24/29* (2013.01); *H01L 24/32* (2013.01); *H01L 24/75* (2013.01); *H01L 24/81* (2013.01); *H01L 24/95* (2013.01); *H01L 25/065* (2013.01); *H01L 25/50* (2013.01); *H01L 2221/68322* (2013.01); *H01L 2221/68327* (2013.01); *H01L 2221/68354* (2013.01); *H01L 2221/68363* (2013.01); *H01L 2221/68381* (2013.01); *H01L 2224/0401* (2013.01); *H01L 2224/05644* (2013.01); *H01L 2224/29144* (2013.01); *H01L 2224/32225* (2013.01); *H01L 2224/83001* (2013.01); *H01L 2224/83192* (2013.01); *H01L 2224/95001* (2013.01)
(58) Field of Classification Search
CPC ....... H01L 24/29; H01L 24/32; H01L 25/065; H01L 25/50; H01L 2221/68322; H01L 2221/68327; H01L 2221/68354; H01L 2221/68363; H01L 2221/68381; H01L 2224/0401; H01L 2224/05644; H01L 2224/29144; H01L 2224/32225; H01L 2224/83001; H01L 2224/83192; H01L 2224/95001
USPC .................................................. 257/773, 774
See application file for complete search history.

(56) References Cited

U.S. PATENT DOCUMENTS

| 8,383,460 | B1* | 2/2013 | Yim ..................... H01L 21/6835 438/118 |
| 2007/0163992 | A1* | 7/2007 | Michalk ................ H01L 21/563 216/41 |
| 2010/0258543 | A1 | 10/2010 | Mizuno et al. |
| 2013/0334713 | A1* | 12/2013 | Xu ...................... H01L 21/6836 257/783 |

FOREIGN PATENT DOCUMENTS

| DE | 102009009828 A1 | 9/2010 |
| WO | WO-8908927 A1 | 9/1989 |

OTHER PUBLICATIONS

"International Application Serial No. PCT/EP2015/051742, International Search Report dated Jul. 6, 2015", (w/ English Translation), 8 pgs.

"International Application Serial No. PCT/EP2015/051742, Written Opinion dated Jul. 6, 2015", 10 pgs.

* cited by examiner

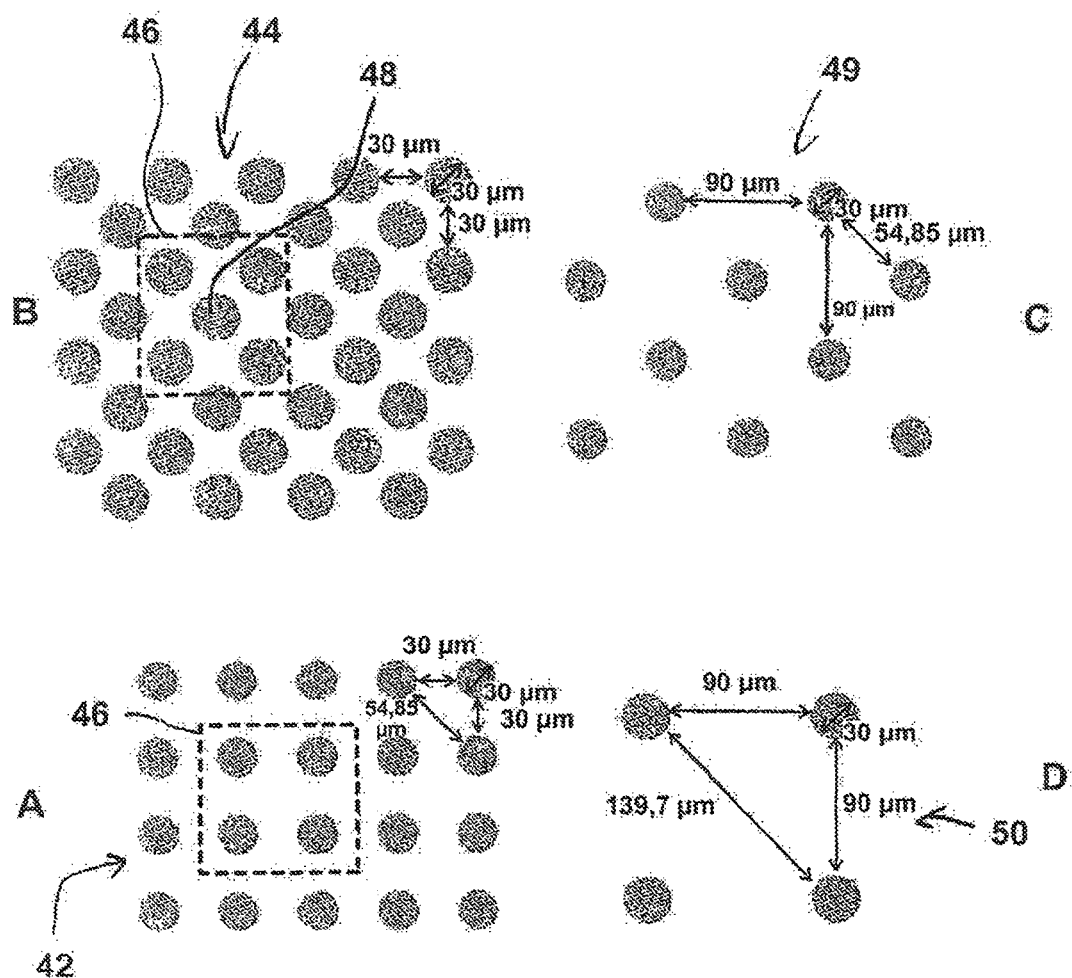
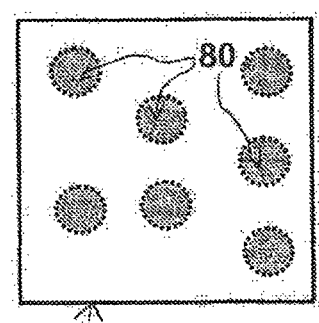
Fig. 3
Fig. 5

METHOD FOR ARRANGING ELECTRONIC SWITCHING ELEMENTS, ELECTRONIC SWITCHING ARRANGEMENT AND USE OF A CARRIER HAVING A BONDING LAYER

PRIORITY APPLICATIONS

This application is a U.S. National Stage Filing under 35 U.S.C. 371 from International Application No. PCT/EP2015/051742, filed on 28 Jan. 2015, and published as WO 2015/114026 A1 on 6 Aug. 2015, which claims the benefit of priority to German Application No. 10 2014 201 635.5, filed on 30 Jan. 2014; which applications and publication are incorporated herein by reference in their entirety.

The subject-matter of the present invention is a method for arranging electronic components on a switching element carrier by means of a carrier having a bonding layer, an electronic switching arrangement, and the use of a carrier having a bonding layer during the arrangement of a plurality of electronic components on one switching element carrier.

The bonding and debonding of wafers is one of the essential key technologies in silicon integration. A number of technologies have already been developed for temporarily bonding a wafer to an intermediate carrier, such as e.g. a carrier wafer, and for detaching them from the carrier wafer according to various method steps, such as for instance re-wiring, bond bumping, or back-thinning. The use of individual chips arranged on carrier wafers, the chips merely being temporary, i.e. being arranged on the carrier wafer in an intermediate step, is less widespread.

Precisely arranging optical electronic components, for instance, on a switching element carrier is difficult. If the component is not arranged on the switching element carrier without tilting, shifting, twisting, or bulging, this component may be functionally limited, for instance due to an altered radiation characteristic or a sensitivity that is directionally dependent. Moreover, further integration of the component may be limited. It is therefore advisable to first arrange the electronic components on an intermediate carrier and to transfer them from this carrier onto the switching element carrier. In this manner it is possible for the intermediate carrier populated with the electronic components to be placed onto the switching element carrier, and for a solder pad present between the switching element carrier and the electronic component to be melted in order thus to produce a permanent bond between the switching element carrier and the electronic components. Technical challenges then arise due to detaching the intermediate carrier from the electronic components.

One solution is to use intermediate carriers on which the electronic components are bonded, at least temporarily, and then debonded. Electrostatic chucks or wax and low melting point adhesive may be used for this. Electrostatic chucks are very expensive, however, and their retention force diminishes because of discharging. Electrostatic chucks would have to be produced individually for each component size and switching carrier arrangement. Moreover, they may only be used with limitations for higher temperatures, like those that occur during reflow soldering.

When using wax and low melting point adhesives, the adhesives melt at temperatures that occur below temperatures for soldering the components on the switching element carrier. This eliminates the fixation when the solder melts and can lead to twists, displacements, and bulges in the components.

Another solution is to use an intermediate carrier that comprises a dense grid of holes that connects the front and back sides of the intermediate carrier. Once the electronic components have been connected to the switching element carrier, for instance by soldering, a solvent is introduced into the intermediate carrier through the holes and thus a bonding layer that was applied to the entire surface area of the front face is dissolved. This method is suitable for wafers and is very expensive, and, once the pieces have been separated, generally the intermediate carriers cannot be re-used.

Another option is to use high melting point adhesives on an intermediate carrier made of glass or light-permeable plastic. Once the components have been connected to the switching element carrier, for instance by means of soldering, the bonding layer, which comprises UV-unstable material and which is arranged on the front face for temporarily attaching the electronic components, is destroyed by means of a laser from the back side of the intermediate carrier and through the intermediate carrier. The components still have to be cleaned afterwards, however. In addition, the method of destroying the bonding layer with a high-performance UV laser is relatively complex.

The object of the present invention is to provide an alternative method for arranging electronic components preferably on a switching element carrier. The object is attained by means of a method according to claim 1, for instance using a bonding layer carrier for producing an electronic switching arrangement according to claim 11.

According to the inventive method, an intermediate carrier in the form of a bonding layer carrier is employed in which, in a first variant, a plurality of bonding points are applied to the intermediate carrier. These bonding points may be produced, for instance, by structuring a bonding layer applied on the entire surface area. Bonding points shall be understood to mean that where necessary the bonding layer may be arranged as a continuous surface on the bonding layer carrier, however the height of the bonding points may project above the rest of the layer and thus preferably exclusively come into contact with an electronic component that is arranged on the bonding layer carrier. The bonding points may be arranged in a grid structure. A grid structure may be understood to be both an irregular grid, i.e. a non-regular grid, and a regular grid having two constant grid vectors.

The bonding points are spaced apart from one another such that the diameter of a bonding point is smaller than a center distance (i.e. the center distance between the bonding points) of two adjacent bonding points. Diameter in this case is the greatest possible distance between two points on the circumference of the bonding point. In the case of a square bonding point, therefore, the diagonal of the square would be the diameter. In the case of a round bonding point, the diameter is equal at all points on the circle.

Since normally the size of the component to be transferred or of the electronic components to be transferred is known in advance, the distance between two bonding points is selected such that an individual component comes into contact with at least three bonding points. It is advantageous when the pattern of the bonding points is selected such that no special orientation of the electronic component on the bonding layer is necessary in order to be connected to more than two bonding points.

In a second variant, the bonding points are initially applied to the at least one electronic component or to the plurality of electronic components (which, at the time the bonding points are applied, have preferably not yet been separated), and the at least one electronic component or the plurality of electronic components are bonded onto a mounting surface face of the bonding carrier. A semiconductor wafer may also be considered an electronic component.

Since the electronic component bonded to the bonding layer carrier is not connected across its entire surface area to a bonding layer, in one exemplary embodiment detaching the plastic carrier may be accomplished in a purely mechanical manner, for instance following an optional connection of the electronic component or components to the switching element carrier, for instance by means of soldering.

The number of bonding points and the strength of the adhesion with which an electronic component is connected is indeed sufficient to prevent displacement, twisting, and/or bulging of the electronic component. However, the average force to tear the electronic component off of the bonding layer carrier is significantly reduced due to the use of bonding points. If a filling factor is introduced as a measure for the surface area filled with bonding points, this filling factor may be between 1% and 50%, for instance. This can reduce the average tear-off force by many times.

The mounting surface of the bonding layer carrier shall be understood to be that surface that is occupied with the electronic component or components.

In one exemplary embodiment, the filling factor or the grid structure is selected such that an electronic component of known size is contacted with 3 to 30, preferably 6 to 15, bonding points. In general the number of bonding points is greater than the number of electronic components.

After the electronic component or components have been bonded to the bonding layer carrier, in one exemplary embodiment the bonding layer carrier is pressed onto a switching element carrier so that the electronic component or components are pressed onto the switching element carrier. If either the switching element carrier or the electronic component now comprises a solder pad, melting the solder pad can create a permanent connection between the electronic component and the switching element carrier. Then the bonding layer carrier is removed, wherein the electronic component or components are not damaged because of the low tear-off force and no further measures are needed for detaching the bonding layer carrier from the electronic components.

This also permits, in a single adjustment and assembly step, a large number of electronic components to be transferred, positioned precisely, from an intermediate carrier onto a switching element carrier within the briefest period of time and the electronic components to be easily removed from the bonding layer carrier.

An electronic switching arrangement produced by means of the method and having a switching element carrier and an electronic component or a plurality of electronic components may be identified, for instance, in that a front face of the electronic component or of at least a portion of the plurality of the electronic components, which front face opposes a first surface of the electronic component that was connected to the switching element carrier, has a plurality of point-like bonding points or bonding residues. Since the bonding points or their residues cover only a small surface area of the electronic component, subsequent complete cleaning of the electronic component is not absolutely necessary. Therefore complex cleaning steps for the electronic component arrangement after the bonding layer carrier has been detached may be omitted.

A bonding layer carrier having an arrangement of a plurality of bonding points in a grid structure for use in such a method is also a part of this application.

The size and spacing of the bonding points depend on the size of the electronic components to be transferred to the electronic switching element carrier. The bonding points are preferably between 0.1 µm and 1 mm in size in their smallest and/or longest dimension. A bonding point in the present application is preferably understood to be a flat circular or oval point or a square. Alternatively, the bonding point may also be understood to be a long, rectangular strip, however.

Preferably a continuous surface bonding layer of preferably uniform height is applied to a smooth bonding layer carrier. The bonding layer carrier preferably comprises or includes glass, a plastic, or a semi-conductor material. The bonding layer is structured after it has been applied as a continuous surface. The structuring may be photolithography, for instance, but may also be performed by means of etching, such as for instance dry etching, laser structuring, or the like. The structuring may be conducted without a mask or with a mask. As stated in the foregoing, it is not necessary for the bonding layer to be completely removed between two bonding points. It is merely required that the bonding points project beyond the rest of the bonding layer such that an electronic component brought into contact with the bonding layer carrier comes into contact, preferably exclusively, with the bonding points. Preferably electronic components in the form of a possibly unhoused chip, i.e. comprising a semiconductor substrate, having edge dimensions between 20 µm and 30 mm, preferably between 50 µm and 5000 µm, are used by means of this method. As mentioned in the foregoing, in the second variant, the bonding layer may also be applied to the electronic component or components and the bonding points may be structured there. This alternative is particularly attractive if the components themselves are still present as wafers and the components are separated on the intermediate carrier or together with the intermediate carrier in a later step. Since these arrangements do not differ from that in which the bonding layer is structured on the bonding layer carrier, for the sake of simplicity, in all variants only the bonding layer carrier will be addressed, even if the bonding points were first transferred to the bonding layer carrier with the component.

In another embodiment, the plurality of bonding points is arranged such that the surface area of these surface points is smaller than the surface area of an electronic component from the plurality of electronic components by a factor of between 10 and 1000 times.

If the bonding points are arranged in the shape of a regular grid, two grid vectors are introduced for describing the grid. The length of the grid vectors is called the pitch. The bonding points are disposed at the beginning points and end points of the vectors. The structure thus created essentially corresponds to a two-dimensional elementary cell of a two-dimensional crystal grid. A two-dimensional elementary cell is also known by the name "primitive cell."

In another embodiment of the method, the adhesive used in the bonding layer carrier is a high melting point adhesive, i.e. the adhesive does not break down and does not become soft at the temperatures that occur during soldering or melting of a solder pad in electronic component arrangements. The melting temperature of the adhesive is thus higher than the melting temperature of the solder, preferably more than 10° K or 5° K higher than the melting temperature of the solder. Adhesives that are only pre-crosslinked and still have sufficient adhesive force to the component may also be employed. For instance, BCB, polyimide, PBO, or epoxides (e.g. SU-8) may be employed as adhesives. Alternatively, other adhesives that are compatible with semiconductors and that have a melting point of greater than 240° C. may be employed for Sn—Ag—Cu standard solders.

In another embodiment, the electronic component or components are preferably LED chips or high-frequency components. Moreover, optical components, such as for instance micromirrors, or MEMS components are possible.

In another embodiment, a plurality of the electronic components are arranged on a bonding layer carrier prior to separation and only then, on the bonding layer carrier, are separated into the individual electronic components. In this manner it is particularly simple to position a plurality of electronic components in an exact arrangement on the bonding layer carrier and correspondingly on the switching element carrier. The electronic components may be separated, for instance, using laser cutting or etching, e.g. dry etching or wet etching.

In another embodiment, after the bonding with the plurality of electronic components, the bonding layer carrier is deconstructed into a plurality of bonding layer carriers. The deconstruction of the bonding layer carrier may take place, for instance, by means of sawing.

In a combination of the foregoing embodiments, therefore, a plurality of electronic component groups may be arranged on a bonding layer carrier, the individual electronic groups may be separated into electronic components, and then the bonding layer carrier may be deconstructed into a plurality of bonding layer carriers.

In another embodiment, a bonding layer carrier already separated in an elementary manner is bonded to a plurality of electronic components that have already been separated. Identical and also different electronic components may be arranged on the individual bonding layer carrier.

In another embodiment, the first surface of the component comprises a solder pad that is contacted, for instance, with a metallization applied to the switching element carrier. If the metallization on the switching element carrier is, for instance, a Cu/Ni/Au metallization, the solder pad may be a tin-silver-copper solder (Sn—Ag—Cu), for instance. If the metallization is a gold metallization, the solder pad may be a gold-tin (AuSn) solder. After melting, the solder is solid and produces a permanent conducting connection between the electronic switching elements and the switching element carrier.

Alternatively, the solder pad may already have been applied to the switching element carrier.

Semiconductor wafers, for instance, but also printed circuit boards, may be used as materials for the switching element carrier.

As stated in the foregoing, the invention also comprises an electronic switching arrangement having a switching element carrier and one or a plurality of electronic components that are each connected with a first surface to a switching element carrier. A front face of the plurality of electronic components facing the surface has residues of the bonding points formerly connected to this surface. These bonding points initially represent impurities that, however, due to their small size do not represent a major drawback, since the size of the remaining surface area offers sufficient space for wire bonding the surface, for instance. An electronic switching arrangement produced by means of the method may be manufactured more rapidly and more precisely in terms of positioning the electronic components, however.

The materials, sizes, etc. of the electronic components and bonding points and connecting structures between the electronic components and the switching element carrier mentioned in the exemplary embodiments in the foregoing are also features of the electronic switching arrangement.

The invention shall be explained in greater detail in the following using a few exemplary embodiments.

FIGS. 3A through 3D depict various bonding point patterns;

FIG. 5 is a top view onto an electronic component that was transferred to a switching element carrier by means of one embodiment of a method;

Figure 1:
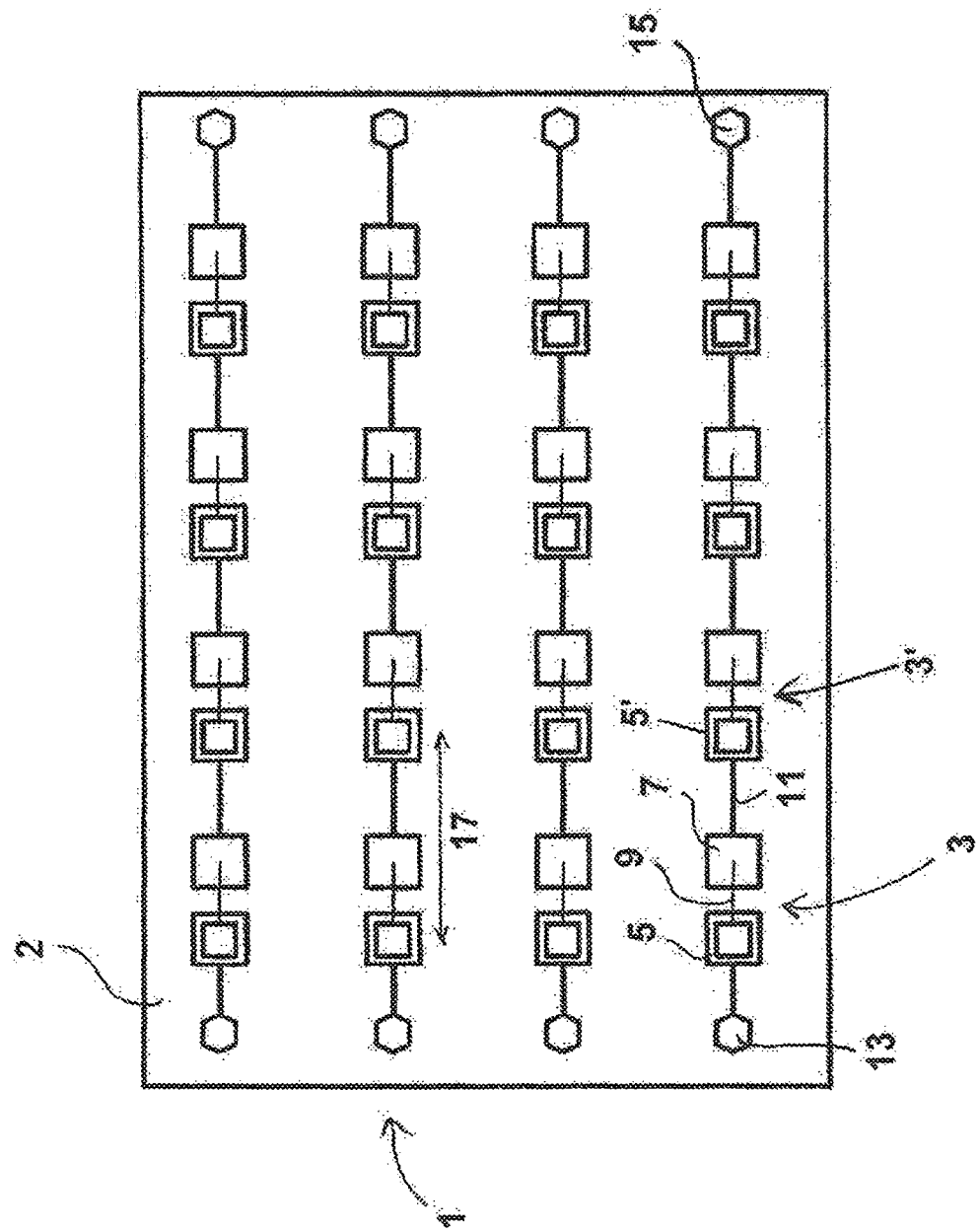
FIG. 1 depicts an embodiment of an electronic switching arrangement according to one embodiment of an inventive method.

FIG. 1 depicts an electronic switching arrangement 1 having a switching element carrier 2 that in the present example is a printed circuit board. The switching element carrier may alternatively be a metal oxide or semiconductor substrate in other embodiments, however. One possible metal oxide would be $Al_2O_3$, for instance. Numerous LED units 3 are arranged on the switching element carrier 2. An LED unit 3 comprises an LED chip 5 that was applied, as an unhoused flat (i.e. level) chip, to the switching element carrier, or to a solder pad arranged thereon, and then connected to the solder pad by means of melting. The LED unit 3 moreover comprises a bond pad 7 that may comprise gold, for instance. The surface area of the bond pad in the present example is on the order of magnitude of the size of the LED chip 5. The LED chip 5 is connected to the bond pad 7 via a bond wire 9. The bond pad 7 is furthermore connected to the conducting solder pad of the adjacent LED chip 5' by means of a metallization 11. In this manner the LED unit 3 is switched in series with the LED unit 3'. The switching element carrier 2 depicted in FIG. 1 comprises 16 LED units that are arranged in four rows of four LED units. A voltage may be applied to each row via connectors 13 and 15 in order to cause the LEDs to illuminate.

In the present example, the edges of the LED chips are 250 μm long. The distance 17 between two adjacent LED chips is 3 mm. Therefore the distance 17 is significantly longer than the length of the LED chip 5 itself. Before the LED chips are arranged on the switching element carrier 2, the printed circuit board is prepared for soldering and printed in the grid of 3 mm with a SnAgCu solder paste so that solder pads 70 μm in height are created below the LED chips, and not visible here. The LEDs were bonded, with the die bond side facing upward, to a bonding layer carrier and transferred from the latter to the switching element carrier and then connected thereto in a reflow soldering step. Even though only 16 LED chips were transferred in the present exemplary embodiment, the electronic switching arrangement may certainly comprise more LED chips, such as for instance more than 100 or more than 500 LED chips. After optional cleaning of the LED chips, the bond wires 9 were applied and the LED chips were wired to the bond pads 7.

A bonding layer carrier like that depicted in FIGS. 2A through 2C is used for transferring the LED chips or other electronic components, such as for instance high-frequency components, on a wafer. FIG. 2A depicts a bonding layer carrier 20 as a round carrier. The bonding layer carrier 20 in the present exemplary embodiment is a glass substrate that has on a front face 22. a bonding layer that is structured such that a plurality of bonding points remain on the front face 22.

Groups of electronic elements 24 are then arranged on the front face 22. In the present example, eight such groups are arranged on the bonding layer carrier 20. In the present example, each electronic component group 24 has a plurality of individual electronic components 26. The electronic component groups 24 may be formed by an individual wafer that is structured before or after the bonding of the electronic component groups, so that, for instance, LED chips are made available. This carrier wafer is then connected to the bonding layer carrier so that the die bond sides (front face) of the electronic component wafers are connected to the bonding layer (and the die bond sides are disposed on top).

Once all electronic component groups 24 are arranged on the bonding layer carrier 20, the individual electronic components 26 may be separated, for instance by means of dry etching. Then the bonding layer carrier may be sawed so that the numerous bonding layer carriers created by this each comprise the separated electronic components of a single electronic component group.

FIG. 2B depicts a cut-out 28 of the bonding layer carrier 20. The electronic component group 24 may be seen in the cut-out 28, wherein the individual electronic components 26 are now separated. For the sake of easier understanding, the electronic components in the present example are depicted as transparent in order to depict the plurality of bonding points, illustrated here as point pattern 30, that are arranged between the bonding layer carrier and the electronic component group 24. For the purposes of further clarification, the cut-out 32 is depicted further enlarged in FIG. 2C. Various separated electronic components 26 may be seen as dotted lines in FIG. 2C. These electronic components are bonded to a plurality of bonding points 34. In the present example, the electronic components have an edge length 36 of 250 µm. The bonding points 34 have a diameter 38 of 30 µm. The distance 40 from center to center of two adjacent bonding points, measured from the center of each, is 60 µm.

The size and arrangement of the bonding points and the bonding point pattern created thereby is selected such that, regardless of the exact orientation of the electronic components on the bonding layer carrier, each electronic component is connected to at least three bonding points. This prevents the electronic component from being displaced, twisted, or bulged as soon as it has been fixed on the bonding layer.

The bonding layer carrier 20 illustrated here was first coated with a complete adhesive layer approx. 3 µm thick. The adhesive used in this exemplary embodiment is a polyimide. Thinner layer thicknesses, such as for instance layer thicknesses of approx. 0.05 µm or 0.1 µm to 20 µm are also possible. The layer thickness of the adhesive depends, inter alia, on the smoothness of the die bond sides of the electronic components. The smoother these die bond sides are, the thinner the layer thickness may be. Thicker layer thicknesses make sense for chip surfaces with correspondingly detailed, high topography. After a complete bonding layer has been applied, it is structured such that the bonding point pattern 30 is created across the entire surface area to be filled with electronic component groups, the so-called mounting surface. Then the electronic component groups are connected to the bonding layer carrier, the electronic components are separated, and the bonding layer carrier is sawed into a plurality of bonding layer carriers.

Even though in the present example the bonding points have been selected as round points, other geometries are possible. If the point is oval, the diameter is interpreted as twice the length of the long semi-axis. For square bonding points, the diagonal is selected as the diameter. For rectangular bonding points, the diameter is the connection line between two corners at opposing ends.

Based on the selected bonding point pattern, the force that is required for detaching the separated electronic components is significantly reduced compared to a full surface-area bonding layer. In the arrangement of bonding points depicted in FIG. 2C, the filling factor is approx. 39%, i.e., the surface area covered by bonding points makes up approx. 39% of the entire surface area.

Additional examples of bonding point patterns are provided in FIGS. 3A through 3D. The bonding point pattern 42 in FIG. 3A is identical to the bonding point pattern depicted in the FIG. 2. A bonding point pattern 44, as depicted in FIG. 3B, has a higher filling factor, since an additional bonding point 48 is arranged in the elementary mesh 46 (see FIG. 3A).

Another bonding point pattern 49 is depicted in FIG. 3C. It is distinguished from the pattern depicted in FIG. 3B merely by the distances between the bonding points. The filling factor attained here is 10%.

The pattern 50 depicted in FIG. 3D is essentially the same as the pattern depicted in FIG. 3A, wherein, however, the distances between the bonding points are significantly greater. The filling factor here is 5%.

The force that is necessary to detach an electronic component from the bonding layer carrier drops depending on the selected filling factor. The force necessary for mechanically separating the bonding layer carrier and an electronic component is essentially linear to the filling factor. That is, at a filling factor of 0.05, the force necessary for detaching an electronic component from the bonding layer carrier is only one-fifth of the force necessary at a filling factor of 0.25. Compared to a filling factor of 1, the force is again significantly reduced since full surface-area bonding effects a non-linear increase in the force necessary for the separation.

Figure 2:
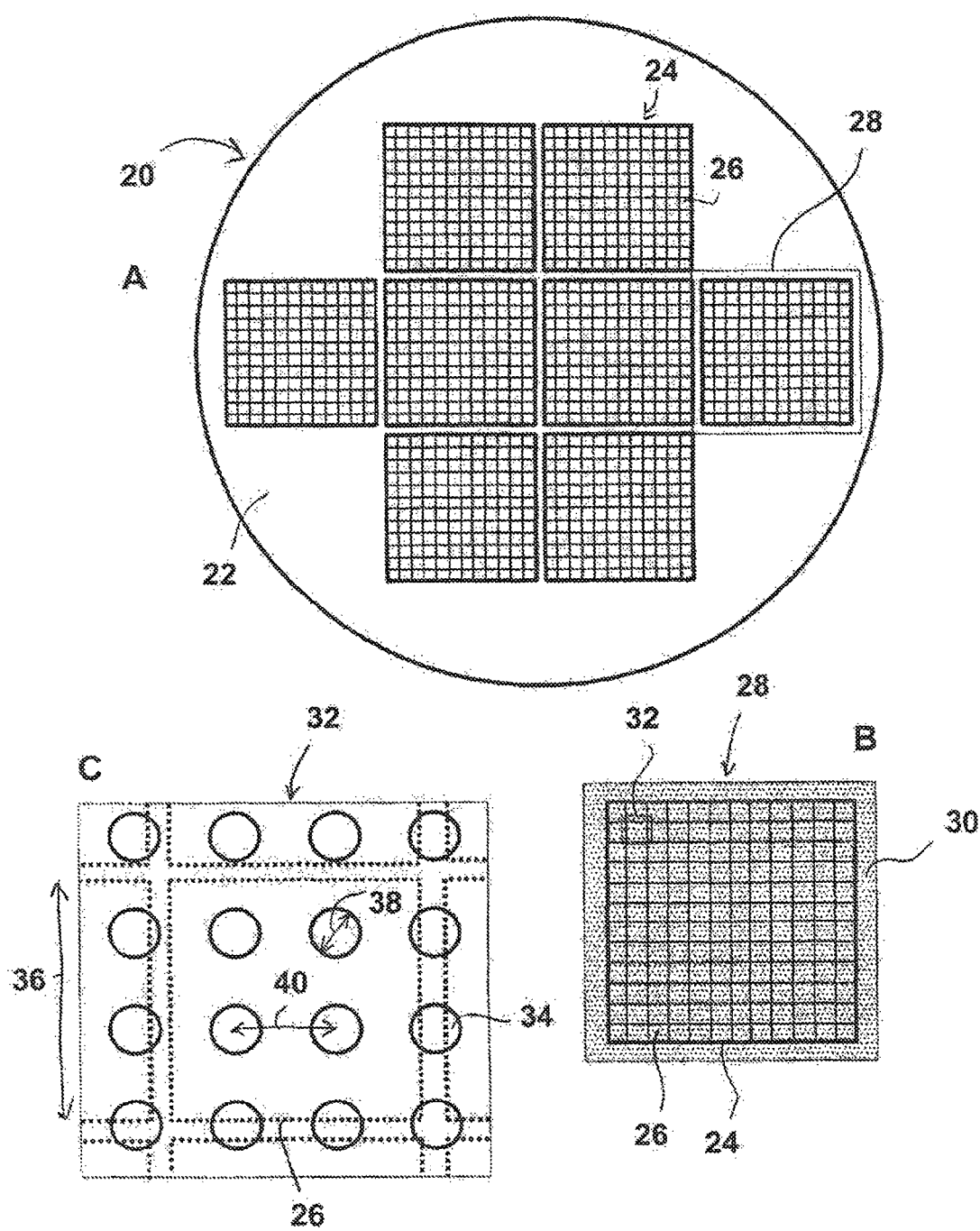
FIGS. 2A through 2C depict views of one embodiment of a bonding layer carrier.

FIGS. 4A through 4E are intended to explain how an electronic component group arranged, for instance, on a bonding layer carrier from FIG. 2 can be transferred to a switching element carrier, such as is illustrated, for instance, in FIG. 1, so that only a portion of the plurality of electronic components arranged on the bonding layer carrier are connected to the switching element carrier. FIG. 4A depicts a bonding layer carrier 60 made of glass. It comprises a bonding point pattern in a bonding layer 62 that, in the present example, comprises BCB. The bonding layer carrier 60 has a thickness of 500 µm. The layer thickness of the bonding points is 15 µm. It should be noted here that, in the present example, the bonding layer is applied to the entire surface area of the glass carrier, wherein however except for the bonding point in the form, for instance, of one of the patterns from FIG. 3, the thickness of the remaining bonding layer is reduced. As a result, the electronic components adhere merely to the bonding points. Disposed on the bonding layer 62 is a plurality of electronic components 64 that were already separated in a previous process step. Furthermore depicted is a switching element carrier 66 that is constructed, for instance, of aluminum oxide. Arranged on the aluminum oxide is a metallization 68 with a solder pad 70 applied thereto. The solder pad may be made of different substances depending on the electronic components and the metallization used. An example would be gold-tin solder and gold metallization. The distance 72 between two adjacent solder pads in the present example is four times greater than the distance between two adjacent electronic components 64 on the bonding layer carrier 60. If the bonding layer carrier is now aligned opposite the switching element carrier 66, as depicted in FIG. 4B, and pressed thereagainst, four electronic components 64 come into contact with corresponding solder pads 70. By heating the arrangement, the solder pads are melted and the electronic components 64 are connected to the switching element carrier in a material fit. If the bonding layer carrier 60 is now removed from the switching element carrier 66 in the direction 74, as depicted in FIG. 4C, the electronic switching elements 64 remain on the solder pads 70, whereas the remaining components 76 remain on the bonding layer carrier. The remaining electronic components may be arranged on another switching element carrier 66' that is constructed identical to the switching element carrier 66, as is depicted, for instance, in FIG. 4D, in that the bonding layer carrier is offset by the distance 78 of two adjacent electronic components.

Figure 4:
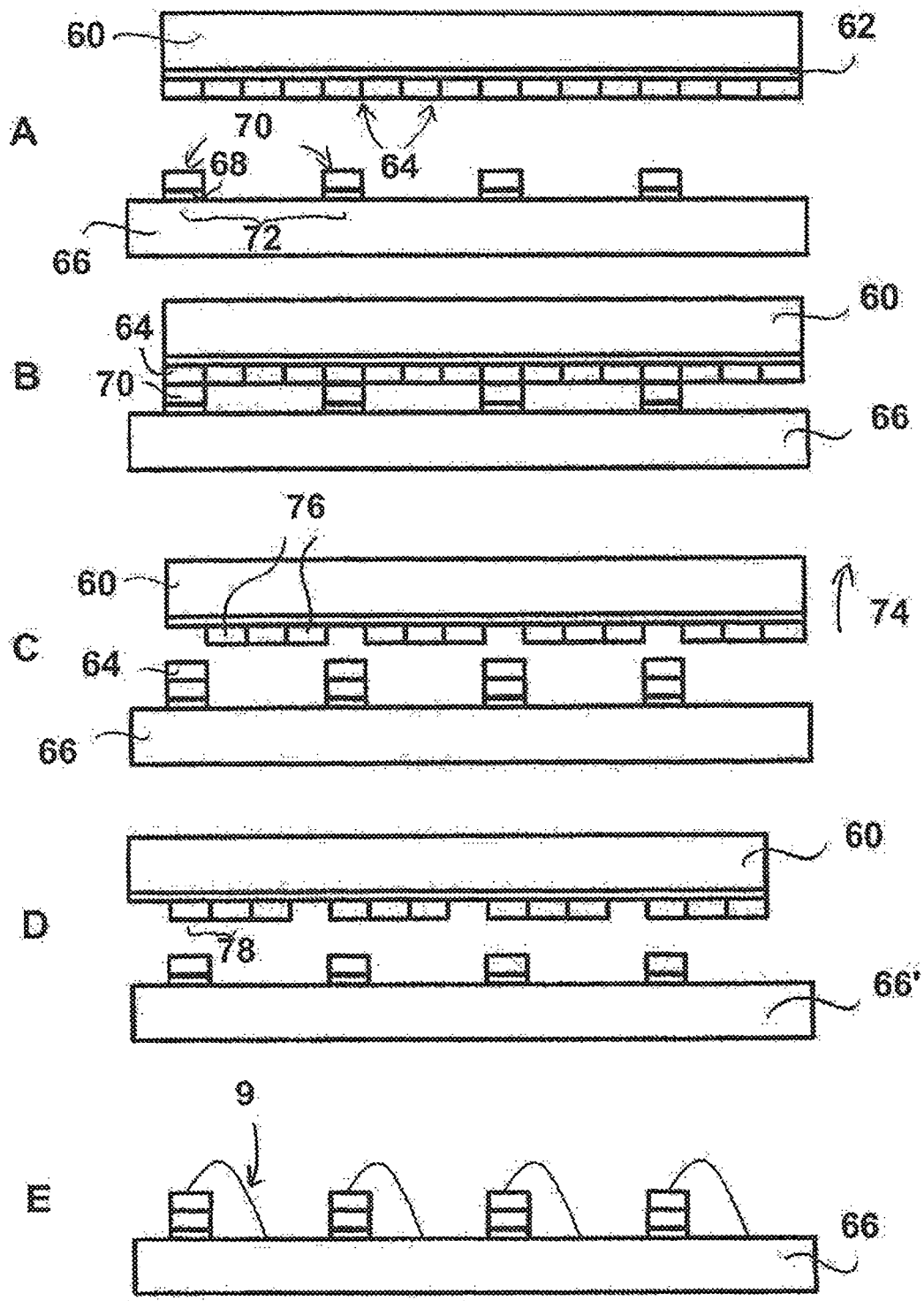
FIGS. 4A through 4E illustrate various intermediate steps of a method.

At this point it should be noted that, even though FIG. 4 merely depicts a cross-section through the bonding layer carrier and the switching element carrier, it is not only electronic components along a row that are transferred from the bonding layer carrier to the switching element carrier, but rather electronic components along the entire surface area. Thus, the sixteen LED chips depicted in FIG. 1 may be applied to the switching element carrier, for instance, within one process step, connected thereto by means of reflow soldering, and the bonding layer carrier with the remaining LED chips may be removed. Once the electronic components have been permanently connected to the switching element carrier, they may be connected to further metallization structures of the switching element carrier 66, for instance by means of wire bond. This is illustrated in FIG. 4E. In the exemplary embodiment in FIG. 4, the solder pad is initially arranged on the switching element carrier. However, in other exemplary embodiments it is possible for the solder pads to be applied directly onto the electronic components. In this case, only the metallization pad 68 remains on the switching element carrier, so that, during the melting process, only the electronic components arranged over the one metallization pad 68 are permanently connected to the switching element carrier.

FIG. 5 depicts an uncleaned LED chip 5 as shown in FIG. 1. Residues 80 from the bonding points formerly connected to the LED chip are disposed on the surface formerly arranged on the bonding layer carrier. If desired, these residues may be removed during a cleaning. However, since there is sufficient unsoiled surface area, wiring may also be conducted without such a cleaning. The bonding point residues indicate that the electronic component was transferred to the electronic switching element arrangement with the method described here.

Another advantage of the method described is that the bonding layer carrier may be used multiple times. This effects further acceleration of the manufacture of electronic switching arrangements like that in FIG. 1.

Since thin wafers are also difficult to manage with automated equipment, they are bonded to carrier wafers and after processing or for changing the processing side must be detached again. In the exemplary embodiment described here, the bonding of a wafer to a bonding layer carrier is described, which bonding layer carrier is used to thin a semiconductor wafer and/or to provide a semiconductor wafer with through-contacts, wiring layers or bumps. In FIG. 6A, first a thin bonding layer 80 of typically 5 μm is applied to the carrier wafer 81 (bonding layer carrier) and structured lithographically so that a plurality of bonding points 82 are distributed across the carrier wafer. Then, corresponding to FIG. 6B, the semiconductor wafer 83 is bonded to the carrier wafer 81 under pressure and temperature, wherein a bonding connection is created between the structured adhesive and the semiconductor wafer. The wafer stack 84 thus created from carrier wafer and semiconductor wafer is mechanically stable enough that the semiconductor wafer may be thinned or, as a thinned wafer 85, may be provided with through-contacts, thin film layers, or bumps 86 (FIG. 6C).

In addition to the bonding points, a complete bonding ring 87 may be structured on the carrier wafer edge, as is shown in the detail in FIG. 6D. During bonding, this ring seals the open gap with the bonding points and prevents media from wet processes, such as, for instance, electrolytes from electroplating, solvents during delacquering, and DI water during spray cleaning, from entering.

In the exemplary embodiment depicted, the wafer stack 84 is placed in an appropriate solvent 88 for debonding (FIG. 6E). First only the bonding ring has contact with the solvent and slowly dissolves. The wafer stack 84 with dissolved bonding ring is shown in FIG. 6F. After the sealing bonding ring has been detached, the solvent can penetrate into the gap 89 of the wafer stack and dissolves the bonding points 82 (FIG. 6G) so that the thinned semiconductor wafer 85 provided with bumps may be detached. Compared to a full surface-area bonding connection, the time for dissolving the adhesive from the structured bonding points is significantly reduced. Compared to a clean bonding ring, the bonding points distributed across the surface area impart greater stability to the thinned wafer.

In another variant, the method is to be used to detach separated thin chips after the processing of the semiconductor wafer and to bond them to a substrate, for instance with a bonding tool.

Figure 6:
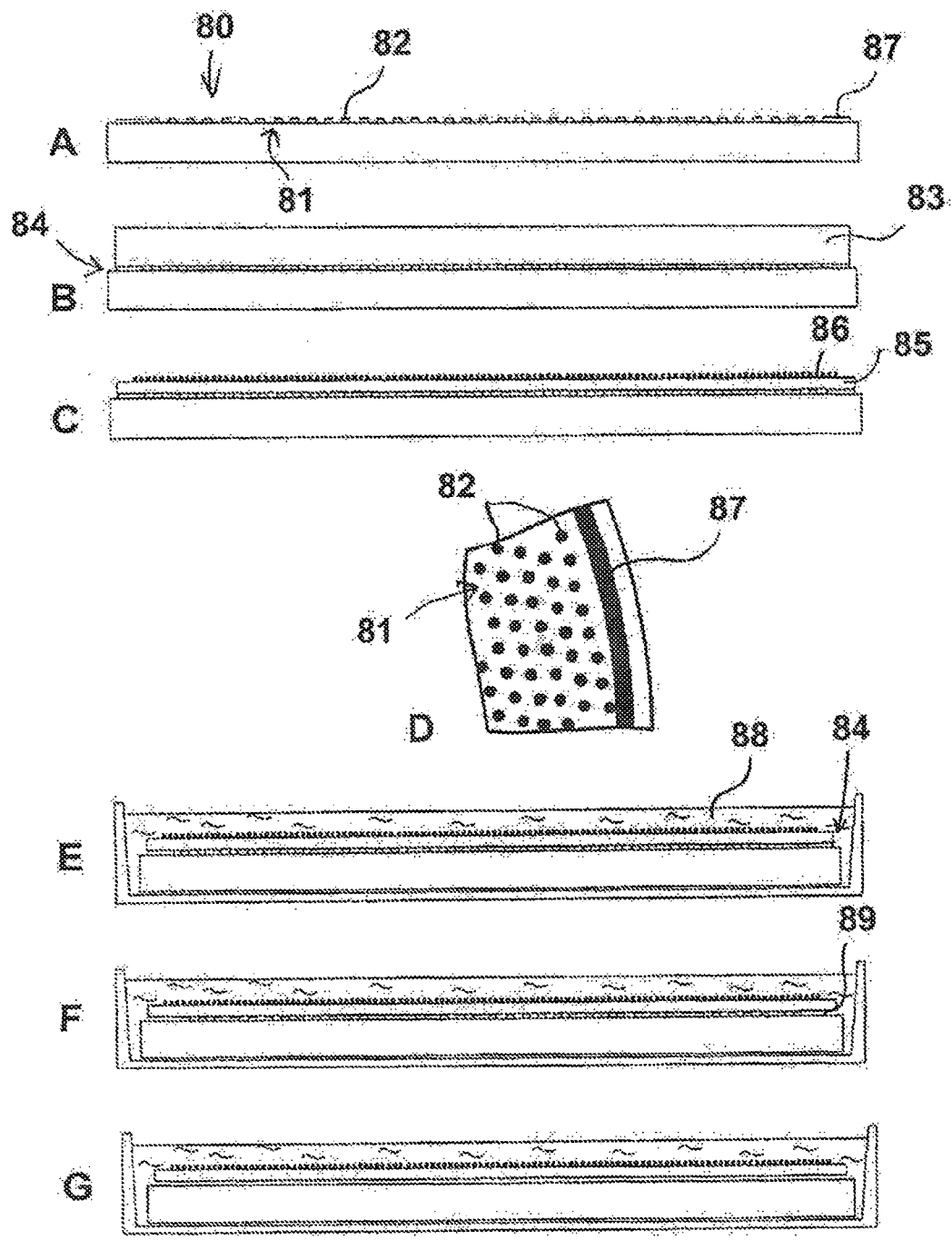
FIGS. 6A through 6G illustrate intermediate results of one variant of a method.

As described in the description of the exemplary embodiment in FIG. 6, a wafer assembly 90 made of a carrier wafer 91 with structured bonding points 92, sealing ring 93, and semiconductor wafer 94 is formed (FIG. 7A). In the wafer assembly, the semiconductor wafer 94 is provided with bumps 95 and divided into individual electronic components 96 and 97, e.g. using a dry etching step with a mask (FIG. 7B). Separation is performed with a tool 98 by applying a vacuum, suctioning the separated components, and separating the bonding points to the carrier wafer (FIG. 7C). The removed components 96 and 97 may be deposited directly onto a substrate 99 with the tool 98, or may be deposited after flipping, and are bonded using force and temperature, e.g. using thermocompression welding or thermode soldering (FIG. 7D).

In other cases it is provided that the thinned chip is bonded to a substrate in reflow soldering. The chip is deposited onto the substrate and no force is exerted on the chip using the bonding tool while the solder melts. In the following variant, therefore, the chip is soldered to the adhesive carrier, which is present backwards, in order to prevent the thin chip from bulging during the reflow soldering.

Figure 8:
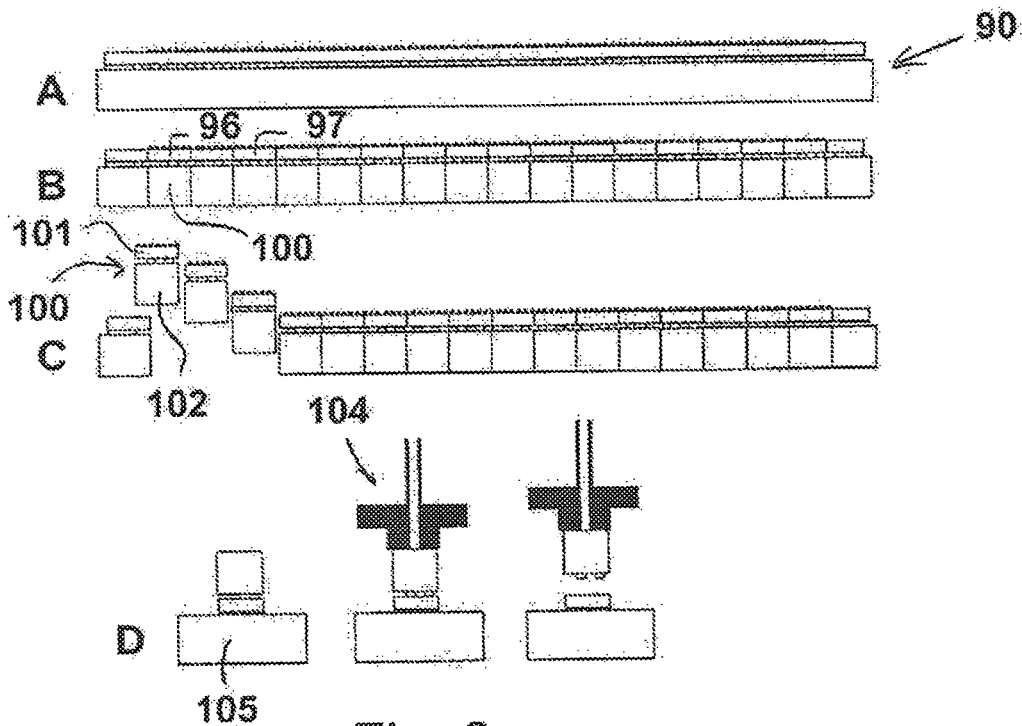

As is described in the last two embodiments, a wafer assembly 90 is formed from carrier wafer 91 with structured bonding points 92, optional sealing ring 93, and a semiconductor wafer 94 (FIG. 8A). The semiconductor wafer 94 is provided with bumps 95 in the wafer assembly 90.

Figure 7:
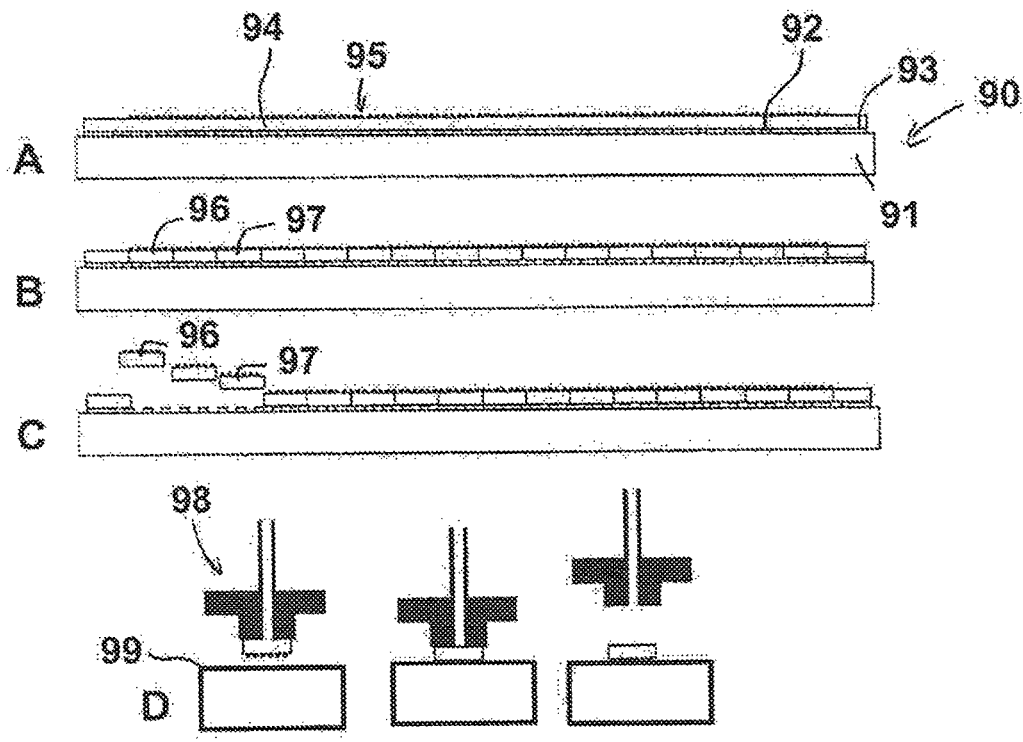
FIGS. 7A through 7D illustrate intermediate results of another variant of a method; and, FIGS. 8A through 8D illustrate intermediate results of another variant of a method.

The individual electronic components 96 and 97, contrary to the exemplary embodiment in FIG. 7 with the carrier substrate, are divided by sawing (FIG. 8B). The separated chip stacks 100 comprise a thinned semiconductor chip 101 and an adhesive carrier substrate 102 of the same size in terms of the bottom surface area. The chip stack is taken up with a tool 104 by applying a vacuum and suctioning (FIG.

8C). The chip stack is deposited directly onto a substrate 105, or is deposited after flipping, and is connected to the substrate using no force by melting the solder (FIG. 7D). The component can self-center due to the surface tension of the liquid solder. The thickness of the adhesive carrier chip offers high stiffness so that the thinned semiconductor chip does not bend. Once the solder has hardened, the adhesive carrier chip 102 is separated from the semiconductor chip using suction and lifting with a tool.

Additional examples result by combining the different features described here.

The invention claimed is:

1. A method for arranging electronic components, wherein the method comprises the following steps:
   a) Pasting a first front face of an bonding layer carrier having at least one, electronic component on a mounting surface of the bonding layer carrier, wherein the front face and/or the at least one electronic component is provided with a plurality of bonding points and a diameter of and a distance between bonding points are selected such that the at least one electronic component is capable of being attached by at least three bonding points to the bonding layer carrier; wherein a plurality of electronic components is present and the plurality of electronic components are connected on the bonding layer carrier before the pasting and are separated into individual electronic components after the pasting, and are separated by etching;
   b) Arranging at least a portion of the at least one electronic component on a switching element carrier and connecting the at least one electronic component to said switching element carrier;
   c) Detaching the at least one electronic component from the bonding layer carrier using a solvent or a mechanical force that separates the bonding layer carrier and the switching element carrier from one another.

2. The method according to claim 1, wherein the at least one electronic component is an optical component.

3. The method according to claim 1, wherein the bonding points are enclosed by an additional bonding ring.

4. The method according to claim 1, wherein a surface area of a plurality of bonding points is smaller than a surface area of the at least one electronic component by a factor of between 10 and 1000 times.

5. The method according to claim 1, wherein the plurality of bonding points are arranged in a grid structure and the grid structure is a regular grid.

6. The method according to claim 1, wherein the bonding layer of the bonding layer carrier is applied to the entire surface of the bonding layer carrier before the pasting and then is structured such that only the plurality of bonding points remains as bonding surface.

7. The method according to claim 1, wherein the bonding layer carrier comprises a semiconductor substrate, a glass substrate, or a plastic substrate and/or the bonding points are made of BCB, polyimide, PBO, or SU-8 or another high melting temperature adhesive.

8. The method according to claim 1, wherein the at least one electronic component comprises a semiconductor substrate, and is an LED chip or high-frequency chip.

9. The method according to claim 1, wherein, after the pasting, the bonding layer carrier is divided into more than one bonding layer carrier, and is sawed.

10. The method according to claim 1, wherein the at least one electronic component, with its top side, is bonded to the bonding points, the back side of the at least one electronic component has a solder pad, and the solder pad is melted for connecting the at least one electronic component to the switching element carrier.

11. The method according to claim 1, wherein the switching element carrier comprises a plurality of solder pads, the solder pads are arranged in a regular manner, and the solder pads are melted for connecting a plurality of electronic components to the switching element carrier.

12. An electronic switching arrangement having a switching element carrier and at least one electronic component that with a first surface are connected to the switching element carrier, wherein a front face of the at least one electronic component facing away from the surface has a plurality of point-like bonding points or point-like bonding residues.

* * * * *